United States Patent [19]

Hansell, III et al.

[11] Patent Number: 5,597,317

[45] Date of Patent: Jan. 28, 1997

[54] SURFACE MATING ELECTRICAL CONNECTOR

[75] Inventors: George A. Hansell, III, Newark; John Voltz, Hockessin, both of Del.

[73] Assignee: W. L. Gore & Associates, Inc., Newark, Del.

[21] Appl. No.: 514,335

[22] Filed: Aug. 11, 1995

[51] Int. Cl.⁶ ........................................... H01R 9/09
[52] U.S. Cl. ........................... 429/289; 439/140; 439/141
[58] Field of Search ................................... 439/140, 141, 439/259, 289

[56] References Cited

U.S. PATENT DOCUMENTS

| | | |
|---|---|---|
| 3,193,793 | 7/1965 | Plunkett et al. ........................ 439/289 |
| 3,441,898 | 4/1969 | Nodfelt .................................. 439/289 |
| 3,731,258 | 5/1973 | Spicer ................................... 439/289 |
| 3,806,801 | 4/1974 | Bove . |
| 3,911,361 | 10/1975 | Bove et al. . |
| 3,963,986 | 6/1976 | Morton et al. . |
| 4,027,935 | 6/1977 | Byrnes et al. . |
| 4,038,599 | 7/1977 | Bove et al. . |
| 4,066,312 | 1/1978 | Faure . |
| 4,227,149 | 10/1980 | Faure et al. . |
| 4,506,215 | 3/1985 | Coughlin . |
| 4,518,910 | 5/1985 | Hottenrott et al. . |
| 4,554,506 | 11/1985 | Faure et al. . |
| 4,622,514 | 11/1986 | Lewis . |
| 4,686,464 | 8/1987 | Elsasser et al. . |
| 4,734,046 | 3/1988 | McAllister et al. . |
| 4,816,754 | 3/1989 | Buechele et al. . |
| 4,843,315 | 6/1989 | Bayer et al. . |
| 4,901,013 | 2/1990 | Benedetto et al. . |
| 4,966,556 | 10/1990 | Reymond et al. . |
| 5,015,946 | 5/1991 | Janko ..................................... 439/140 |
| 5,061,192 | 10/1991 | Chapin et al. . |
| 5,137,461 | 8/1992 | Bindra et al. . |
| 5,225,777 | 7/1993 | Bross et al. . |
| 5,248,262 | 9/1993 | Busacco et al. . |
| 5,256,073 | 10/1993 | Reymond et al. . |
| 5,259,781 | 11/1993 | Baumberger et al. . |
| 5,281,150 | 1/1994 | Bundga et al. . |

*Primary Examiner*—Gary E. Elkins
*Attorney, Agent, or Firm*—Victor M. Genco, Jr.

[57] ABSTRACT

A buckling beam type electrical connector is provided which is operable to selectably protect the contact ends of the buckling beam elements from physical damage.

24 Claims, 14 Drawing Sheets

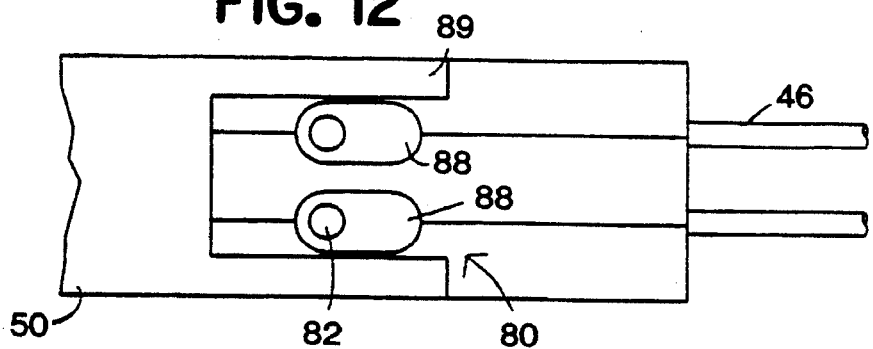
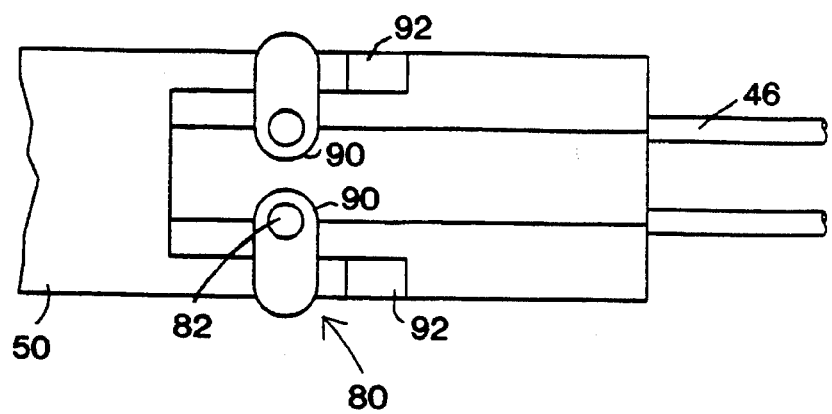
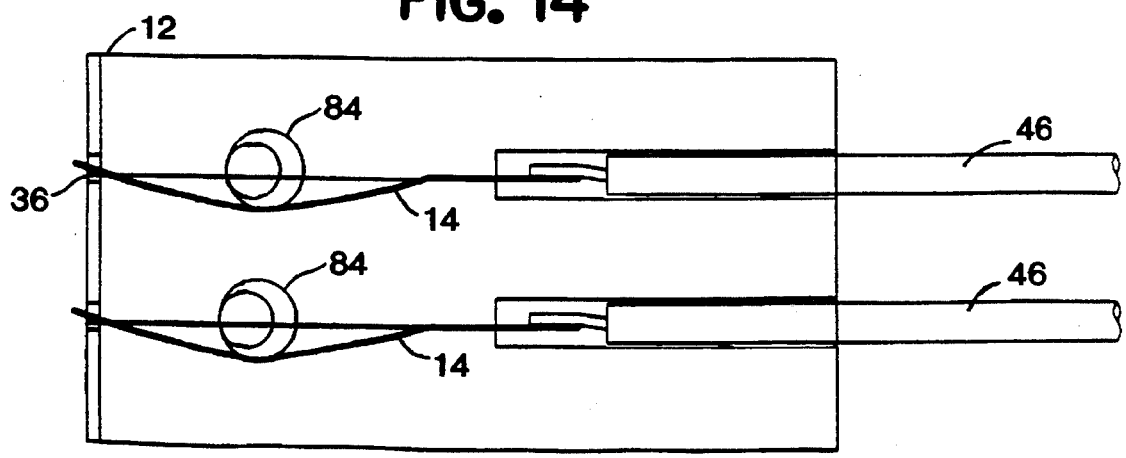

SURFACE MATING ELECTRICAL CONNECTOR

FIELD OF THE INVENTION

This invention generally relates to electrical connector assemblies. More particularly, the present invention relates to an improved electrical connector having buckling beam probes which are shielded to be protected from physical damage.

BACKGROUND OF THE INVENTION

Connectors for forming separable connections between electrical conductors are well known and useful. Most of these connectors employ a sliding fit between two mating, contact elements. Some connectors utilize the electrical conductors themselves, e.g. traces on a printed circuit board (PCB) or flexible wires, as one of the mating contacts. Such a design simplifies the connector assembly. One type of contact element which has been advantageously used is described as a buckling beam test probe or contact.

A buckling beam probe is formed with a length many times its cross-sectional area so that the probe buckles or deflects when a predetermined axial load is applied thereto. A long buckling beam provides a small force plus a relatively uniform force throughout its deflection or buckling range. This enables the same force to be exerted on each of a plurality of pads on a semiconductor chip regardless of the deflection of the probe produced by variations in the heights of the pads. The forces for contacting the pad must be kept small so that the pads are not damaged. Accordingly, a buckling beam contact or probe is made sufficiently long with respect to its cross-sectional area such that the force applied to the pads would be determined by the resistance to buckling of the beam.

Buckling direction of a buckling beam contact or probe is typically controlled by accomplishing any one of the following techniques:

(a) offsetting the openings in the upper and lower alignment dies;

(b) disposing the opening of the upper alignment die at an angle relative to the corresponding opening in the lower alignment die to slant the longitudinal axis of the wire; or (c) a combination of offset and angular slanting.

Once the buckling or bending has been initiated by a compressive load perpendicular to the lengthwise beam, a buckling beam probe or contact continues to bend without additional force. Such physical behavior under load is referred to as elastic instability, which typically is considered a structural failure. However, this physical behavior provides a spring contact with uniform force over a wide compliance range which is useful in high density electrical connectors.

Examples of electrical connectors incorporating buckling beam probes or connectors are described in U.S. Pat. Nos. 3,806,801 and 4,066,312.

Although there are many beneficial reasons for employing a buckling beam type connector, a drawback in the employment of such electrical connectors is the ease with which these connectors become damaged, and therefore, not usable. More particularly, because a buckling beam probe must be long and thin to retain elasticity after repeated buckling cycles, and because the ends of such probes typically protrude through the housing structure of an electrical connector, these fragile probes are easily damaged. As may be appreciated by one skilled in the art, in an electrical connector which incorporates buckling beam type probes, achieving and maintaining, over the life of the electrical connector, normal force of the individual probes within a predetermined range is critical for the reliable operation of the electrical connector, and the maintenance of low contact resistance between the mating conductive surfaces.

The foregoing illustrates limitations known to exist in present electrical connectors incorporating buckling beam probes. Thus, it is apparent that it would be advantageous to provide an improved electrical connector directed to overcoming one or more of the limitations set forth above. Accordingly, a suitable alternative is provided including features more fully disclosed hereinafter.

SUMMARY OF THE INVENTION

The present invention is an advancement in the art of electrical connectors beyond which is known to date. In one embodiment of the present invention an active electrical connector comprises at least one electrically insulating first housing portion and at least one elongated flexible metal buckling beam element having a predetermined length and width dimension. The length dimension of the buckling beam element is greater than the width dimension. The at least one buckling beam element is positioned in a predetermined location on the first housing portion. Each at least one buckling beam element has a contact end and an opposed termination end. A preshaping or preloading member applies a predetermined load to the at least one buckling beam element in a direction substantially perpendicular to the length dimension of the buckling beam to ensure that the at least one buckling beam element will predictably bend in a predetermined direction. An electrically insulating second housing portion at least partially encloses the at least one first housing portion, the at least one buckling beam element, and the preloading or preshaping member. The second housing portion has a facing surface portion having formed therethrough at least one aperture for permitting extension of the at least one buckling beam element therethrough. The second housing portion is moveable, back and forth, in a direction substantially parallel to the at least one buckling beam, from a first position wherein the second housing portion protectably encloses the contact ends of the at least one buckling beam element, to a second position wherein the contact end of the at least one buckling beam element extends through the aperture.

A mating passive electrical connector housing may be used in conjunction with the active electrical connector. The mating passive electrical connector housing has at least one mating electrical conductor with a surface perpendicular to and aligned with the contact end of the at least one buckling beam. The contact end of the at least one buckling beam electrically communicates with the at least one mating electrical conductor when mating of the active electrical connector and the passive electrical connector causes the second housing portion of the active electrical connector member to be disposed in the second position.

In an alternate embodiment of the present invention an active electrical connector comprises an electrically insulating housing having a facing surface portion having formed therethrough at least one aperture. At least one elongated flexible metal buckling beam element has a predetermined length and width dimension. The length dimension is greater than the width dimension. The at least one buckling beam element is positioned in a predetermined location on the housing portion. Each at least one buckling beam element has a contact end and an opposed termination end. A retractor is operable to selectably retract the at least one buckling beam element within the electrically insulating housing. The retractor is moveable, back and forth, from a first position wherein the at least one buckling beam element is disposed within the housing thereby protecting the contact end of the at least one buckling beam element, to a second position wherein the contact end of the at least one buckling beam element extends through the aperture of the housing.

A mating passive electrical connector housing also may be used in conjunction with the active electrical connector of the alternate embodiment.

It is a purpose of the present invention to provide an improved high density, surface mating, buckling beam contact connector which is operable to selectably protect the contact ends of the buckling beam elements from physical damage.

It is another purpose of the present invention to provide a connector where one of each pair of mating contacts is itself one of the electrical conductors to be connected.

Yet another purpose of the present invention is to provide a large scale connector assembled of modular, simple components which can be readily arranged into various configurations.

BRIEF DESCRIPTION OF THE DRAWINGS

The foregoing summary, as well as the following detailed description of a preferred embodiment of the invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings:

FIG. 12 is a partial side elevational view of a first side of the active electrical connector portion of FIG. 11 shown in a mechanically engaged disposition with respect to the active electrical connector receiving structure;

FIG. 13 is a partial side elevational view of a second side of the active electrical connector portion of FIG. 11 shown in a mechanically engaged disposition with respect to the active electrical connector receiving structure;

FIG. 14 is a partial sectional view of the active electrical connector portion of FIG. 11 shown readied for electrical connection, having buckling beam elements extending through a housing portion;

DETAILED DESCRIPTION OF THE INVENTION

Figure 1:
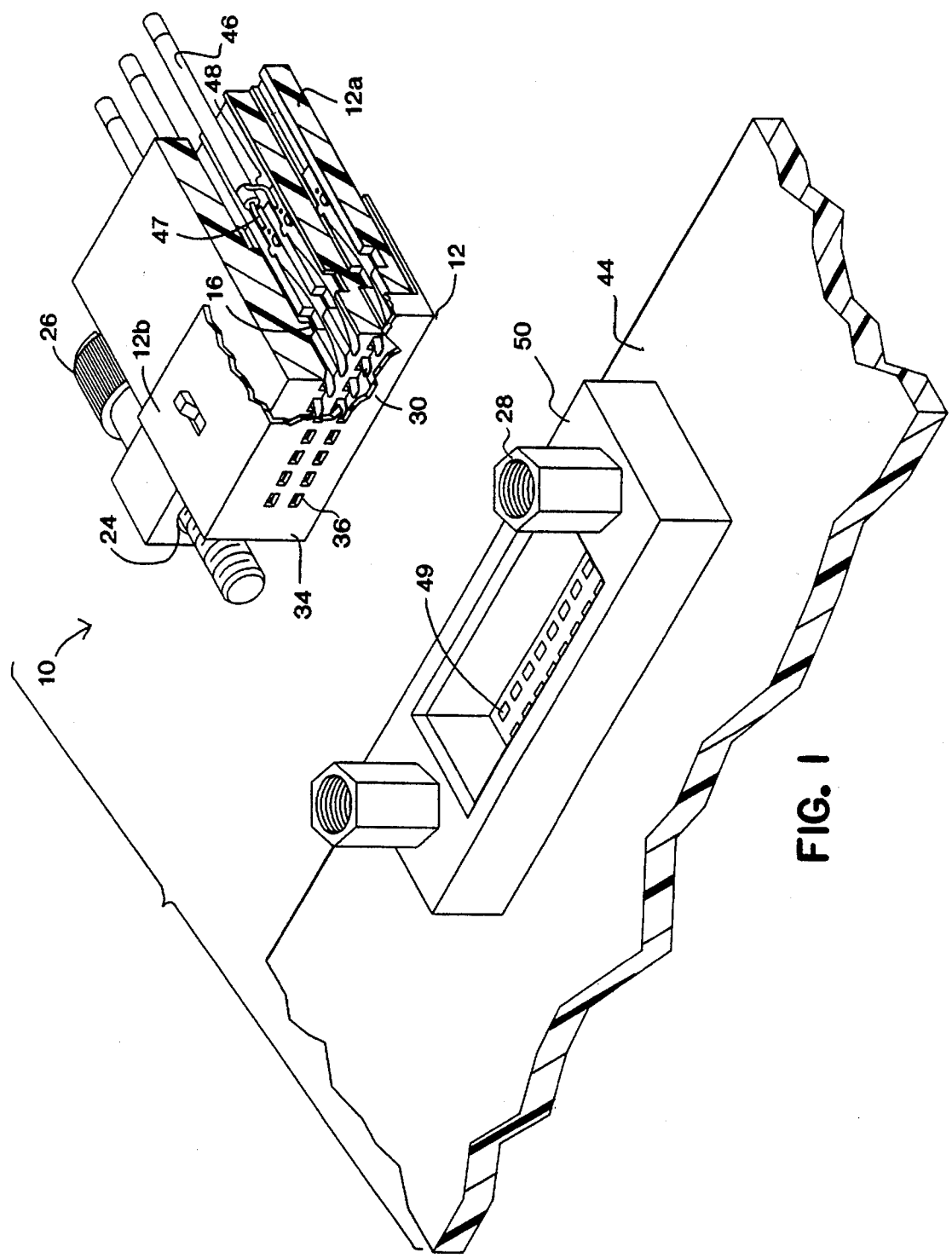
FIG. 1 is an environmental view of one embodiment of a surface mating electrical connector of the present invention readied to be connected to a printed circuit board.

Referring now to the drawings, wherein similar reference characters designate corresponding parts throughout the several views, the active electrical connector of the present invention is generally illustrated at 10. The active electrical connector 10 may be useful in providing a separable electrical connection between connectors, such as but not limited to other active or passive electrical connectors, printed circuit boards, coaxial cable assemblies, multichip modules, integrated circuits, or generally planar conductive surfaces. As used herein, the term active electrical connector shall mean an electrical connector comprised of one or more buckling beam contacts, housings and structure therefor. Also, as used herein, the term passive electrical connector shall mean any electrical conductor portions, housings or structures to which the active electrical connector mates.

As best illustrated in FIGS. 1, 2, 5, 6, and 7 one embodiment of the active electrical connector 10 comprises a housing 12 having a preloading or preshaping member 16 and at least one elongated, flexible metal conductive buckling beam element 14. The housing 12 comprises first and second housing portions 12a and 12b, respectively. The housing portions 12a and 12b are made from an electrically insulating material, such as a thermoplastic material, for example. Suitable thermoplastic materials include, but are not limited to polyphenylene sulfide, polyamide, acetylene-butadiene-styrene terpolymer, polytetrafluoroethylene, polyvinyl chloride, polypropylene, polyethylene, liquid crystal polymer, polyethylene imide, or other suitable engineering grade thermoplastic materials.

The first housing portion 12a fixedly locates at least one buckling beam element 14 in a predetermined location. Typically, the first housing portion 12a fixedly locates a plurality of buckling beam elements in a predetermined linear array or pattern. The buckling beam elements may be fixedly located on the first housing portion 12a by any suitable means, such as by way of a tight fit with a shaped portion 20 of the housing 12, for example. A means for aligning the buckling beam elements is provided, which is illustrated as a suitably dimensioned groove or channel 22. Any suitable alignment means may be employed that functions to orient a contact end of each buckling beam element in a predetermined direction, while permitting each buckling beam element to flex or buckle when subjected to a contact force, as described in detail hereinafter. Also, the preloading or preshaping member 16 may be formed on the first housing portion 12a. Although, the preloading member 16 is shown as an elongated protuberance formed integrally with the first housing portion 12a, the preloading member 16 may be any member which applies a predetermined load to each buckling beam element, in a direction substantially perpendicular to the length of each buckling beam element, such that each buckling beam element bends predictably in a predetermined direction. The first housing portion 12a may have formed therethrough apertures 24 for receiving threaded fasteners 26. Furthermore, the first housing portion 12a may be constructed of several separate shaped pieces of insulating material to facilitate its manufacture.

Figure 2:
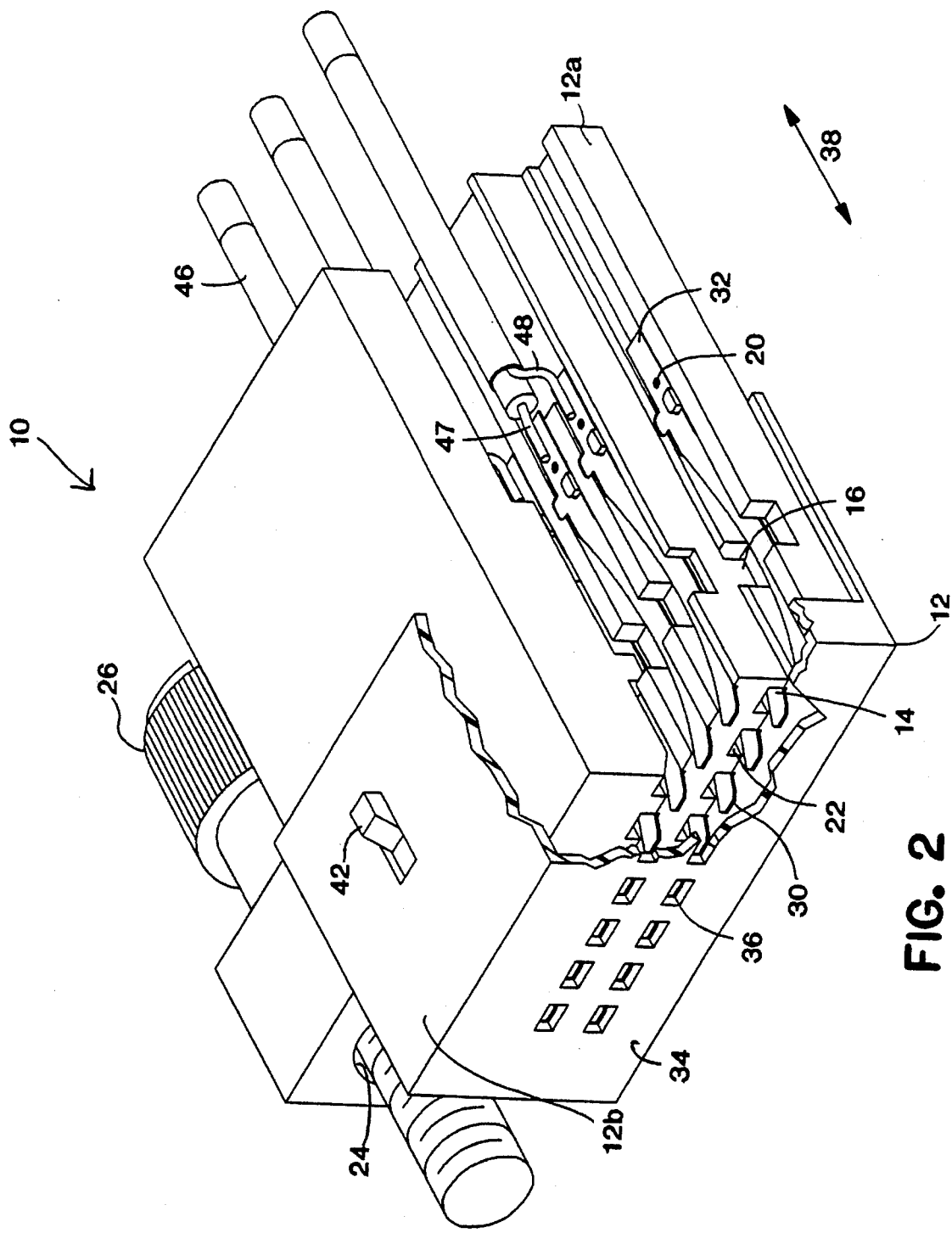
FIG. 2 is a perspective illustration of an active electrical connector portion of FIG. 1, terminating a plurality of coaxial cables.
Figure 3:
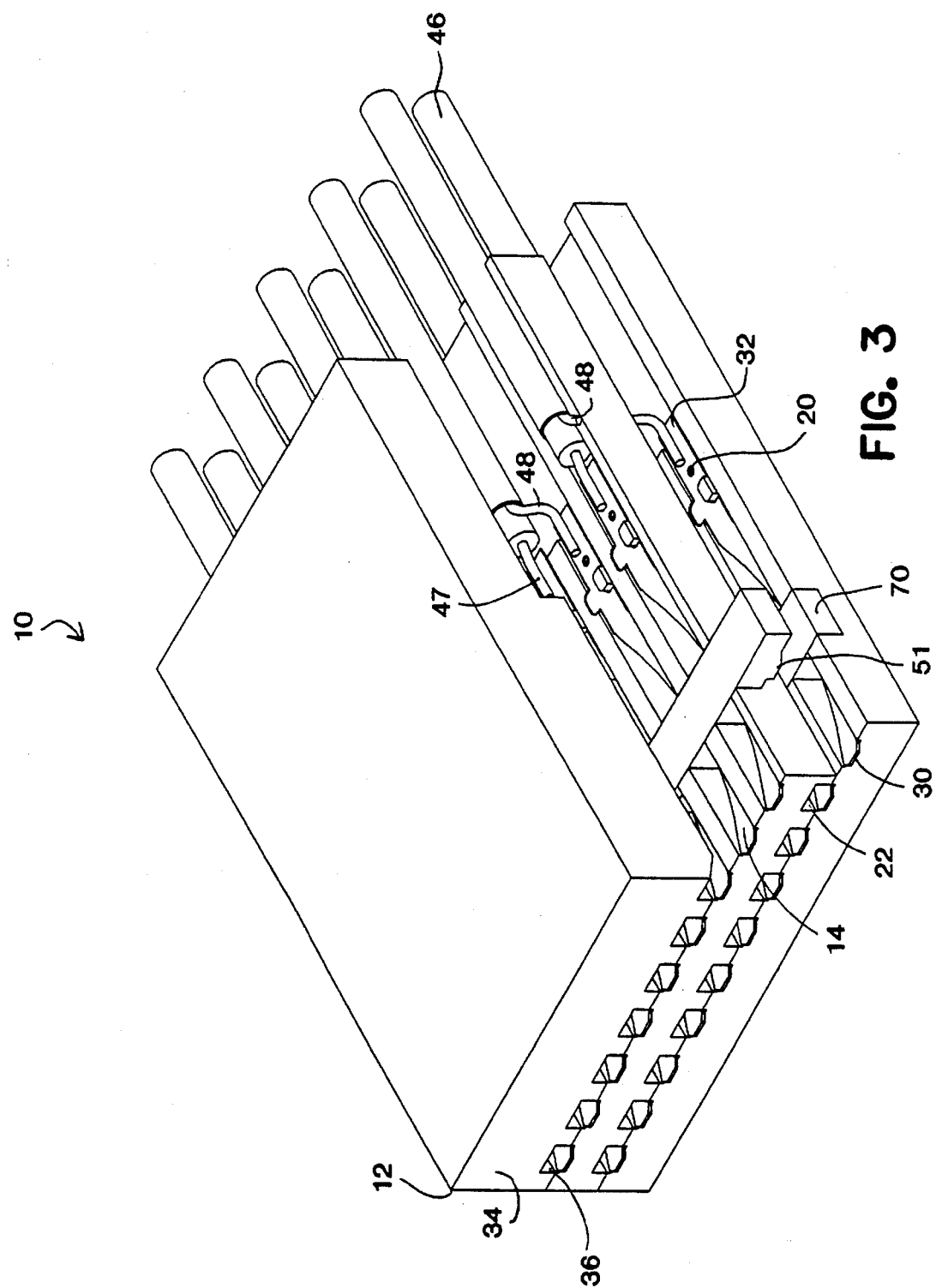
FIG. 3 is a perspective view of an alternate embodiment of the active electrical connector portion of FIG. 2.
Figure 7:
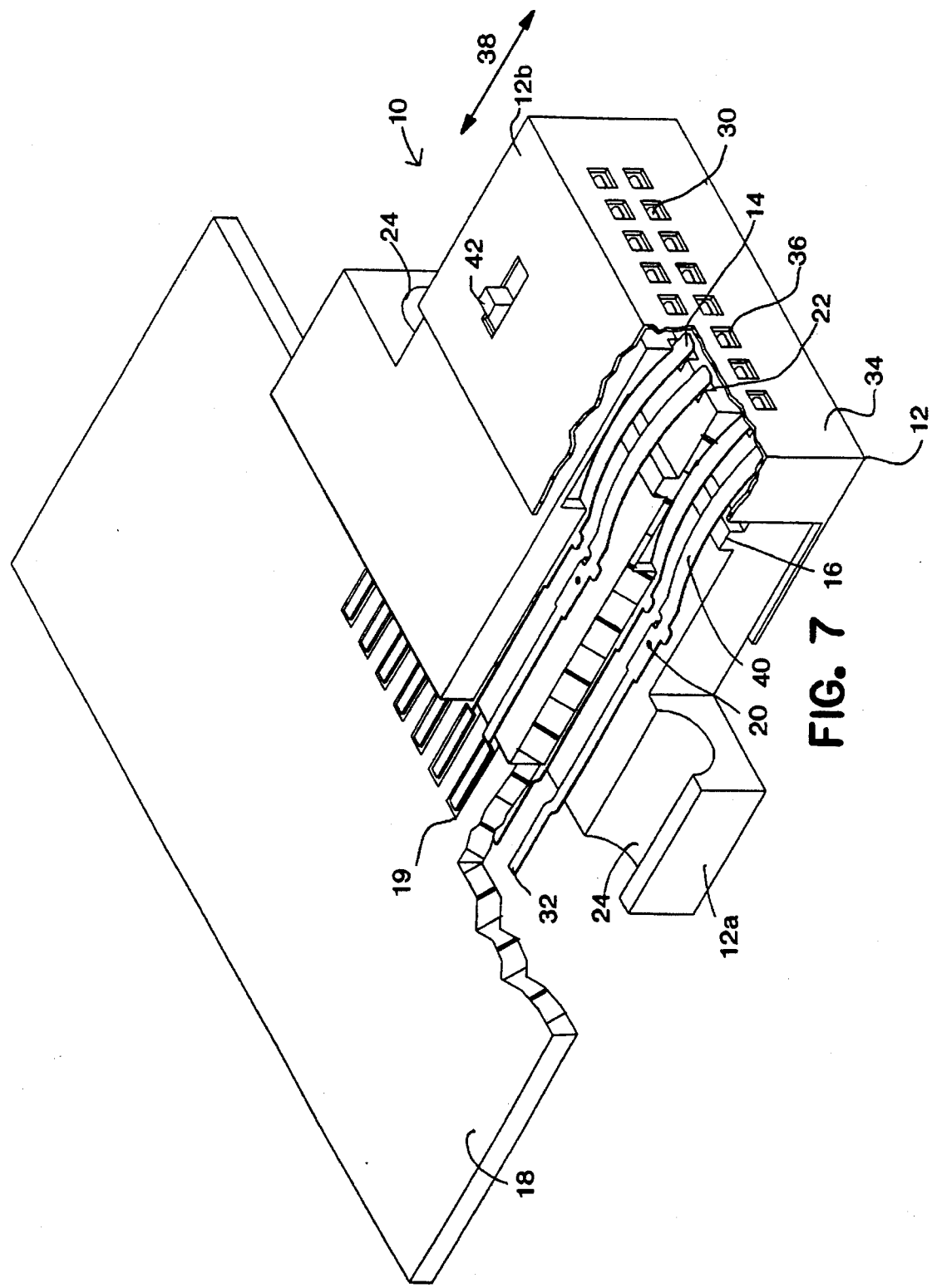
FIG. 7 is a perspective illustration of an alternate embodiment of the present invention, wherein the active electrical connector is straddle mount connected to printed circuit board conductors.

Each buckling beam element 14 has a contact end 30 and a termination end 32. In FIG. 7, each termination end 32 is illustrated electrically terminated to a respective conductive trace 19 of a printed circuit board 18. In FIGS. 1, 2, and 3, each termination end 32 is illustrated electrically terminated to a respective coaxial cable comprising a signal wire 47 and a ground wire 48.

The buckling beam concept, as it is applied to a probe type electrical connector, is described in detail in U.S. Pat. Nos. 3,806,801 and 4,066,312, which are incorporated herein by reference. Generally, each buckling beam element 14 has a length dimension which is greater than the width dimension of the buckling beam. The buckling beam elements 14 are formed of a suitable material which will continue to deflect over a predetermined range when a predetermined force is applied. Suitable materials include, but are not limited to, BeNi, BeCU or tungsten. When the individual buckling beam elements are placed into electrical contact with a conductive element 49, and are moved toward the conductive element, each buckling beam will flex or buckle. As movement toward the conductive element continues, the buckling or flexing will continue without any significant increase in the force applied. The flexing or buckling of the beam causes longitudinal movement of the contact end 30 of each buckling beam element 14, as well as a small transverse movement which provides a wiping action that cleans and removes any oxide or material from the surface of the conductive element. As the contact end 30 of each buckling beam element 14 is forced against a conductive element, that force is transmitted to the shaped portion 20 of the housing 12.

In the embodiment of the present invention illustrated in FIGS. 1, 2, 5, 6, and 7, the second housing portion 12b at least partially encloses the first housing portion 12a, the buckling beam elements 14, and the preloading means 16. The second housing portion has a facing surface 34 which has formed therethrough apertures 36. The apertures 36 are arranged in a linear pattern which mirrors the pattern of the positioned buckling beam elements 14. The apertures 36 are suitably dimensioned to permit extension of the buckling beam elements therethrough. The second housing portion 12b is moveable, back and forth along a path or travel, in a direction substantially parallel to the buckling beam elements, as indicated by the arrow 38. The second housing portion 12b is moveable from a first position wherein the second housing portion protectably encloses the contact ends 30 of the buckling beam elements, to a second position, wherein the contact ends of the buckling beam elements extend through the apertures 36.

Figure 5:
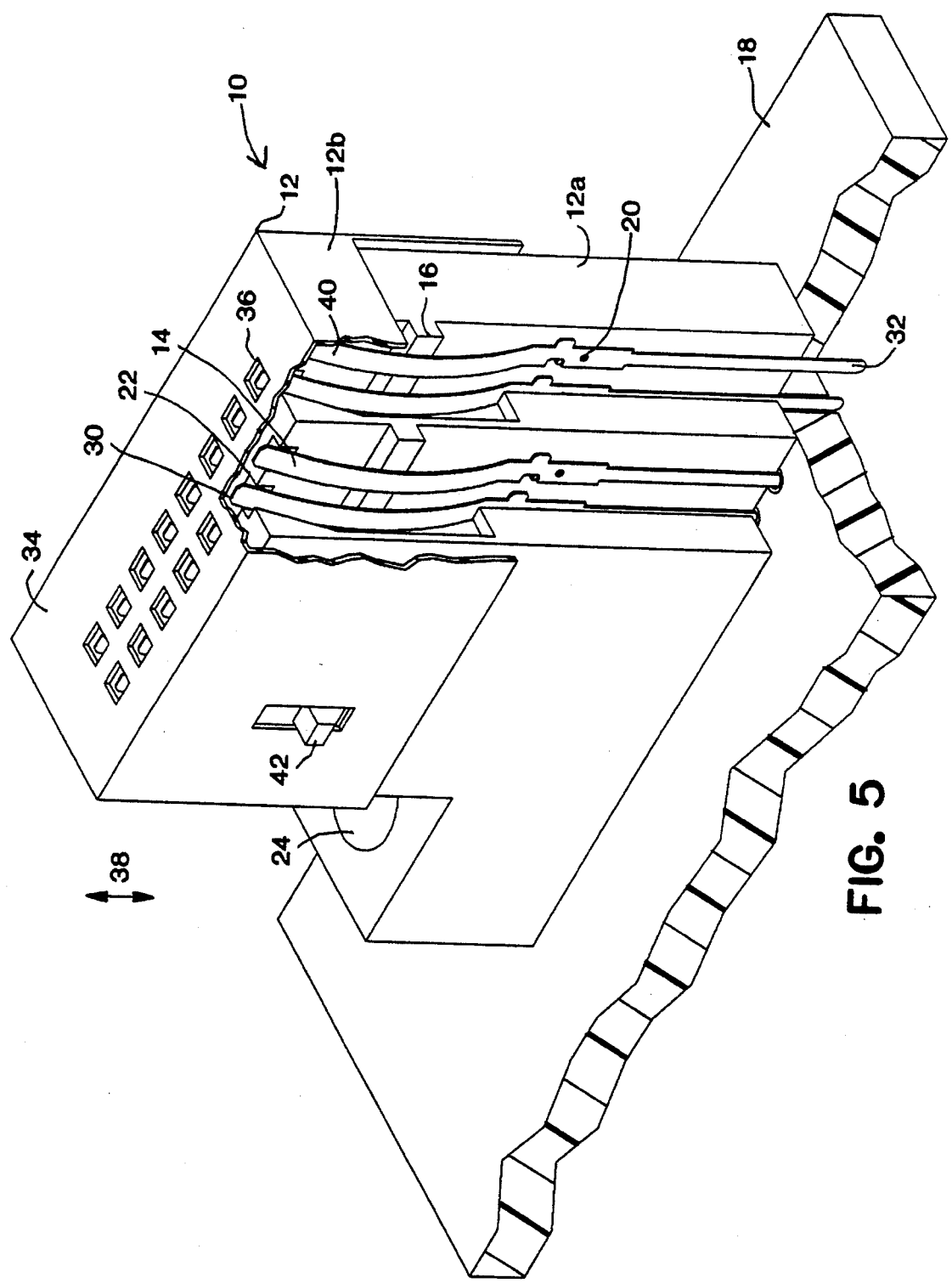
FIG. 5 is a perspective illustration of an alternate embodiment of the present invention, wherein the active electrical connector is illustrated through hole mounted to printed circuit board conductors.
Figure 6:
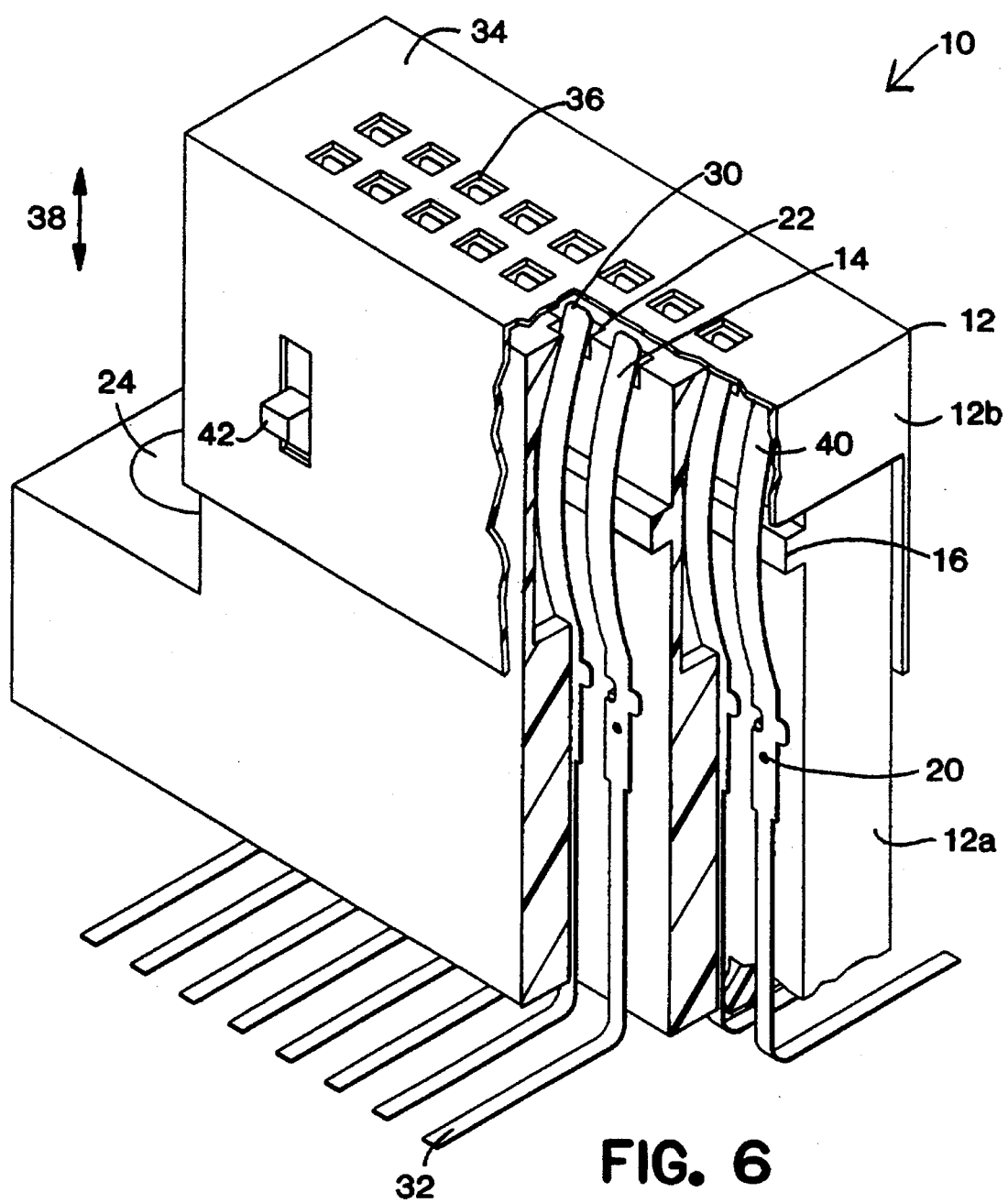
FIG. 6 is a perspective illustration of an alternate embodiment of the present invention, wherein the active electrical connector is illustrated readied for vertical surface mounting to printed circuit board conductors.

A biasing means may be employed to bias the second housing portion 12b into the first position. Any suitable biasing means may be employed including a spring element, or as illustrated in FIGS. 5, 6, and 7, predetermined buckling beam elements 40 may serve as the biasing means. In this regard, the biasing buckling beam elements 40 may be positioned at each lateral end of the array of buckling beam elements to achieve a balanced biasing force upon the second housing portion 12b. These biasing buckling beam elements exert a biasing force on an interior portion of the facing surface 34 of the second housing portion. This can be easily achieved by elimination of the apertures 36 for selected buckling beams.

The active electrical connector 10 may include a range of motion limiting member 42 to limit the back and forth travel of the second housing portion 12b.

The active electrical connector 10 of FIGS. 1, 2, 3, 10 and 11 is shown electrically terminated to a plurality of coaxial cables 46. The active electrical connector 10 of FIGS. 1, 2, 3, 10 and 11 differs from the active electrical connector of FIGS. 5, 6, and 7 in that the termination ends 32 of the buckling beams 14 are typically shorter and contained completely within the housing 12. One embodiment of the active electrical connector 10 of FIGS. 1, 2, 3, 10 and 11 utilizes separate contacts for each signal wire 47 and for each ground wire 48. In other embodiments of the active electrical connector 10 of FIGS. 1, 2, 3, 10 and 11, where electrical performance requirements are less stringent, higher signal density in the connector can be attained by terminating more than one ground wire to one contact. This technique is known as ground commoning. An additional requirement for such an embodiment of the active electrical connector 10 is to provide good strain relief to transfer any load applied to a cable to the housing 12. Potting, molding, clamping, or other suitable means can be used for strain relief.

FIG. 1 is an environmental view of the active electrical connector 10 of FIG. 2. FIG. 1 illustrates the active electrical connector 10 readied for electrical connection to an electrical device 44 by use of a passive electrical connector 50. In FIG. 1, the passive electrical connector is a structural part which guides the active electrical connector 10 to the appropriate position as it is forced against the electrical device 44 so that the contact end 30 of each buckling beam is forced against an appropriate conductive element 49 on the electrical device 44. The threaded fasteners 26 are operable to screwthreadably engage threaded fixtures 28 to removably anchor the active electrical connector 10 in electrical communication with the electrical device 44. Additionally, other means than threaded fasteners 26, such as latches, clips, or detents may be employed to secure the active electrical connector 10 to the electrical device 44, or the passive electrical connector 50.

Figure 10:
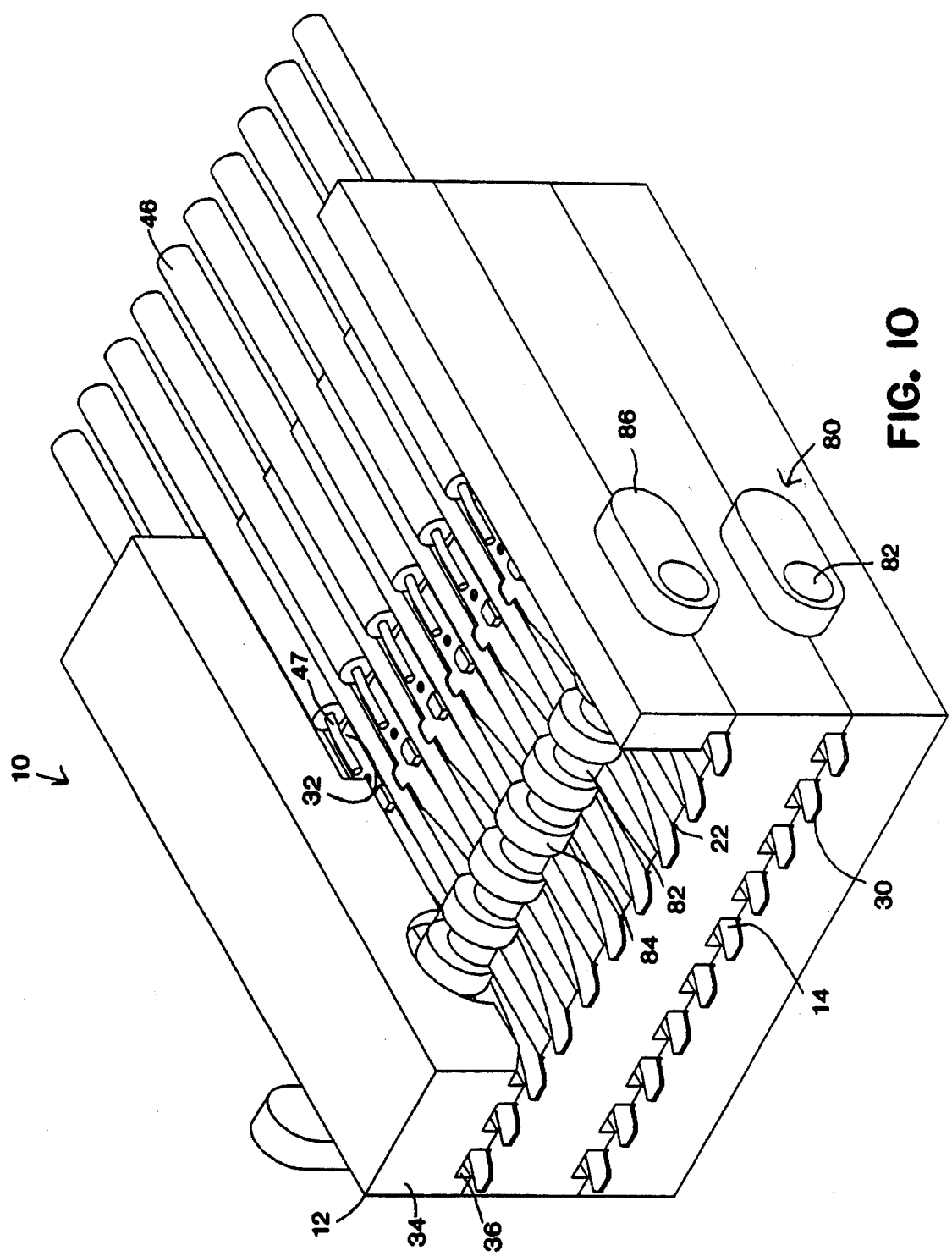
FIG. 10 is a perspective view of an alternate embodiment of the active electrical connector portion of FIG. 2.
Figure 11:
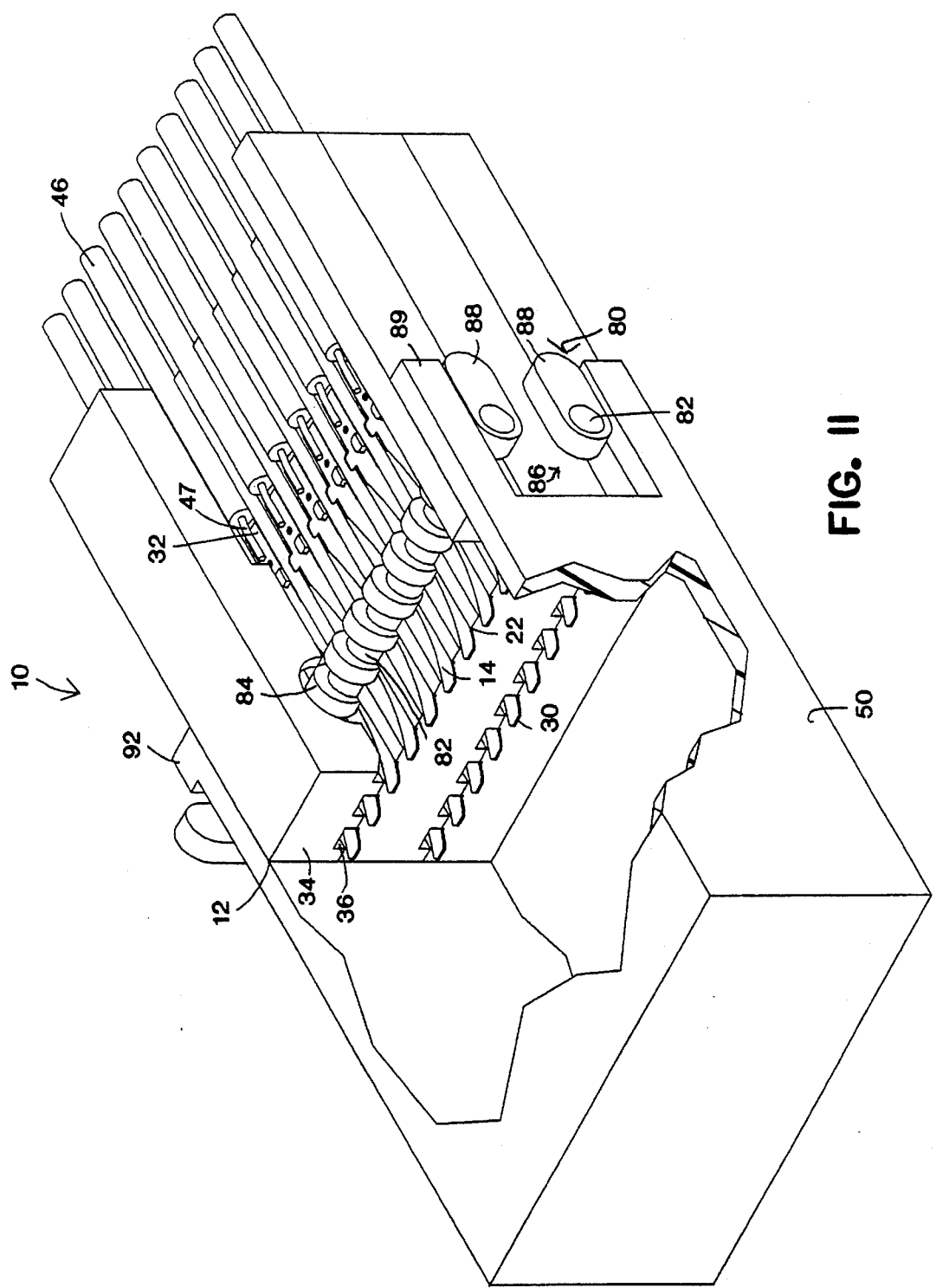
FIG. 11 is a perspective view of the active electrical connector portion of FIG. 10 shown mechanically engaging a structure for receiving the active electrical connector portion.
Figure 15:
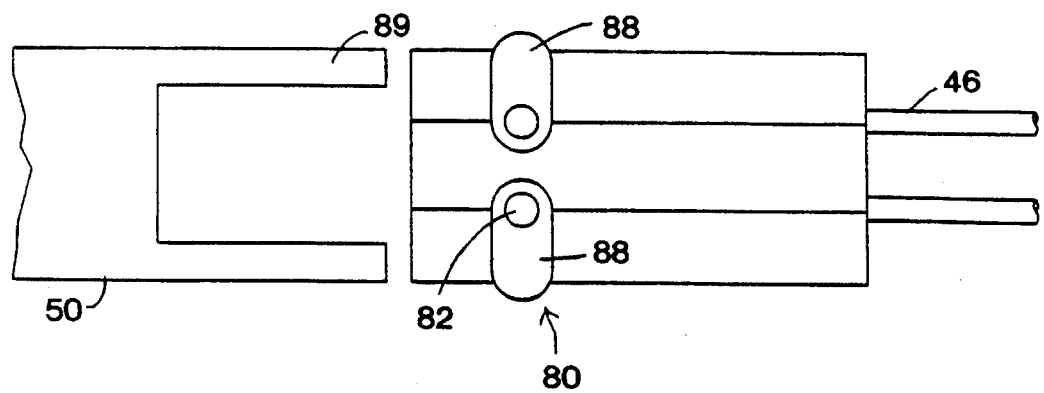
FIG. 15 is a partial side elevational view of a first side of the active electrical connector portion of FIG. 11 shown in a mechanically disengaged disposition with respect to the active electrical connector receiving structure.
Figure 16:
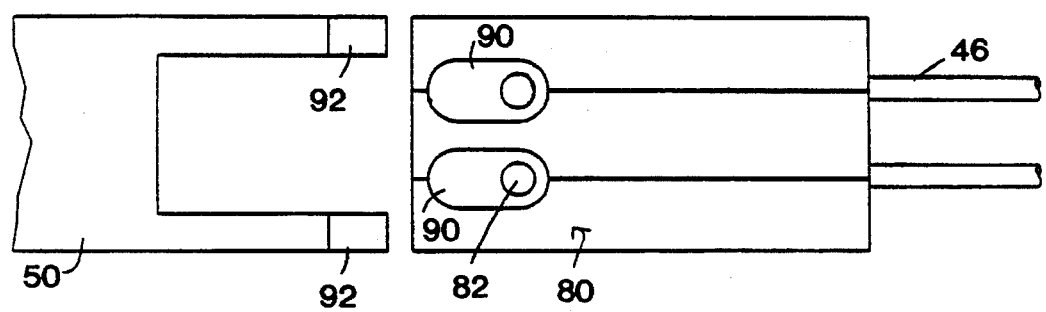
FIG. 16 is a partial side elevational view of a second side of the active electrical connector portion of FIG. 11 shown in a mechanically disengaged disposition with respect to the active electrical connector receiving structure.

FIGS. 3, 10 and 11 illustrate an alternate embodiment of the active electrical connector 10 of the present invention.

This embodiment includes an electrically insulating housing 12 having a facing surface 34, which has formed therethrough at least one aperture 36. At least one buckling beam element is provided which has been described in detail hereinabove. Although the active electrical connector 10 of FIGS. 3, 10 and 11 is shown electrically connected to a plurality of coaxial cables 46, it should be understood the active electrical connector 10 may be terminated to any suitable electrical conductor, such as but not limited to other electrical connectors, a printed circuit board, a multichip module, an integrated circuit, or any other suitable electrically conductive planar array. As may be apparent by comparing and contrasting the active electrical connector 10 of FIGS. 1, 2, 4, 5, 6 and 7 with the active electrical connector 10 of FIGS. 3, 10 and 11, the housing 12 of the active electrical connector of FIGS. 3, 10 and 11 is not moveable to expose the contact ends 30 of the buckling beam elements 14. Instead, the active electrical connector of FIGS. 3, 10, and 11 comprises a means for selectably retracting the buckling beam elements 14 within the electrically insulating housing.

FIG. 3 illustrates one embodiment of an active electrical connector having a means for selectably retracting the buckling beam elements 14 within the electrically insulating housing 12. As illustrated therein, the selectable buckling beam retracting means may comprise a sliding cam type assembly which is illustrated at 70. As best illustrated by the schematic drawings of FIGS. 18 and 19, each sliding cam assembly 70 includes a series of identically shaped cam ramps 51 which are slidable back and forth within the housing from a first position (FIG. 18), wherein the cam ramps engage respective buckling beam elements such that the buckling beam elements are retracted within the housing 12, to a second position (FIG. 19), wherein the cam ramps disengage the respective buckling beam elements such that the buckling beam elements extend through the housing 12. In operation, the sliding cam assembly 70 may function in conjunction with suitable features (not shown) of a passive electrical connector 50 to move in a predetermined direction during mating and unmating of the active electrical connector 10 with the passive electrical connector 50. In such an embodiment, as the active and passive electrical connectors are mated, the cam assembly 70 slides to the second position (cam ramps disengaged). As the active and passive electrical connectors are separated, the cam assembly 70 slides to the first position (cam ramps engaged).

Other suitable buckling beam retracting means include, but are not limited to, a rotary cam assembly 80, such as that illustrated in FIGS. 10-17, for example. The rotary cam assembly 80 is suitable for selectably retracting the buckling beam elements 14 within the housing 12. The rotary cam system comprises a shaft 82 supported within the housing 12, cams 84, and at least one pair of opposed levers 86. As best illustrated by FIGS. 10 and 11, the opposed levers 86 are offset 90°, as will be explained in further detail hereinafter.

Figure 17:
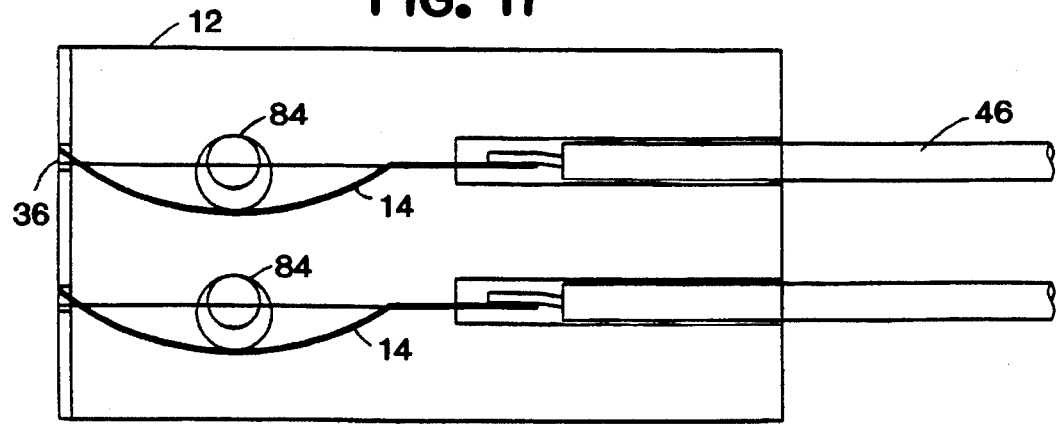
FIG. 17 is a partial sectional view of the active electrical connector portion of FIG. 11 shown disengaged from the active electrical connector receiving structure, having buckling beam elements positioned within the housing portion.
Figure 18:
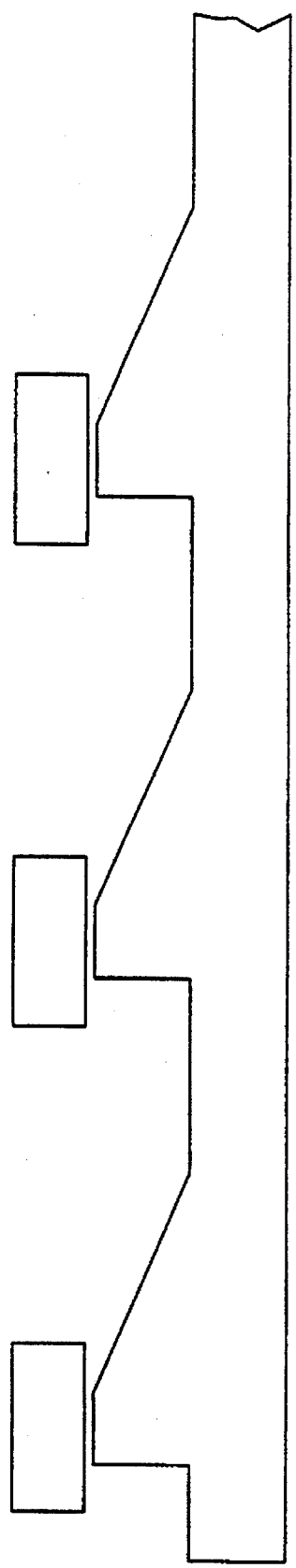
FIG. 18 is a schematic of a sliding cam assembly of the active electrical connector of FIG. 3, wherein the sliding cam is shown in a first, engaged position.
Figure 19:
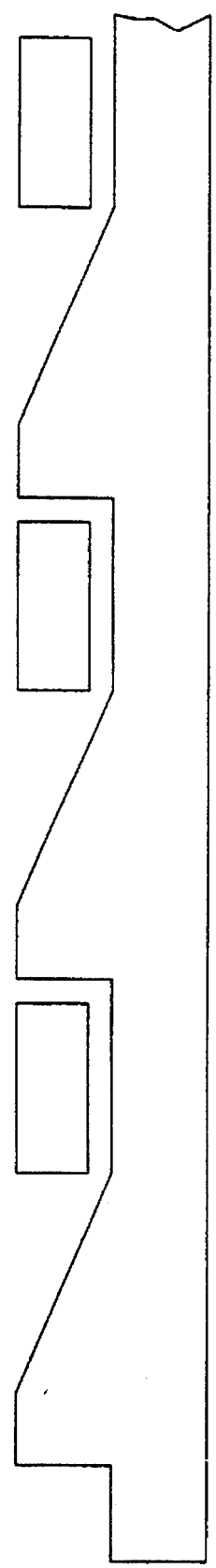
FIG. 19 is a schematic of a sliding cam assembly of the active electrical connector of FIG. 3, wherein the sliding cam is shown in a second, disengaged position.

As illustrated in FIG. 17, when the active electrical connector 10 is not mated, the shaft 82 is oriented such that the high points of the cams 84 are positioned against the buckling beam elements 14o In such a position, the buckling beam elements 14 are retracted within the housing 12. As illustrated in FIG. 18, when the active electrical connector 10 is mated with a passive electrical connector, the shaft 82 is oriented such that the low points of the cams 84 are positioned against the buckling beam elements 14. In such a position, the buckling beam elements 14 are permitted to extend through the apertures 36 from the housing 12.

Operation of the rotary cam assembly 80, when the active and passive electrical connectors are mated, may be best understood by sequential reference to FIGS. 12, 13 and 14. Conversely, operation of the rotary cam assembly 80, when the active and passive electrical connectors are unmated, may be best understood by sequential reference to FIGS. 15, 16 and 17.

Referring to FIGS. 11, 12, 13 and 14, as the active electrical connector 10 is mated with a passive electrical 50, first levers 88 are pushed by a beam 89 extending from the passive electrical connector. When the first levers 88 are rotated approximately 90°, the cam shaft 82 rotates the cams 84 to permit the buckling beam elements 14 to extend through the apertures 36, from the housing 12, toward electrical conductors 49 of the passive electrical connector 50. Oppositely, and referring to FIGS. 15, 16, and 17, when the active electrical connector is unmated, second levers 90 rotate the cam shaft 82 back to its original position by action of a beam 92. Beam 92 does not engage the second levers 90 during mating.

Figure 4:
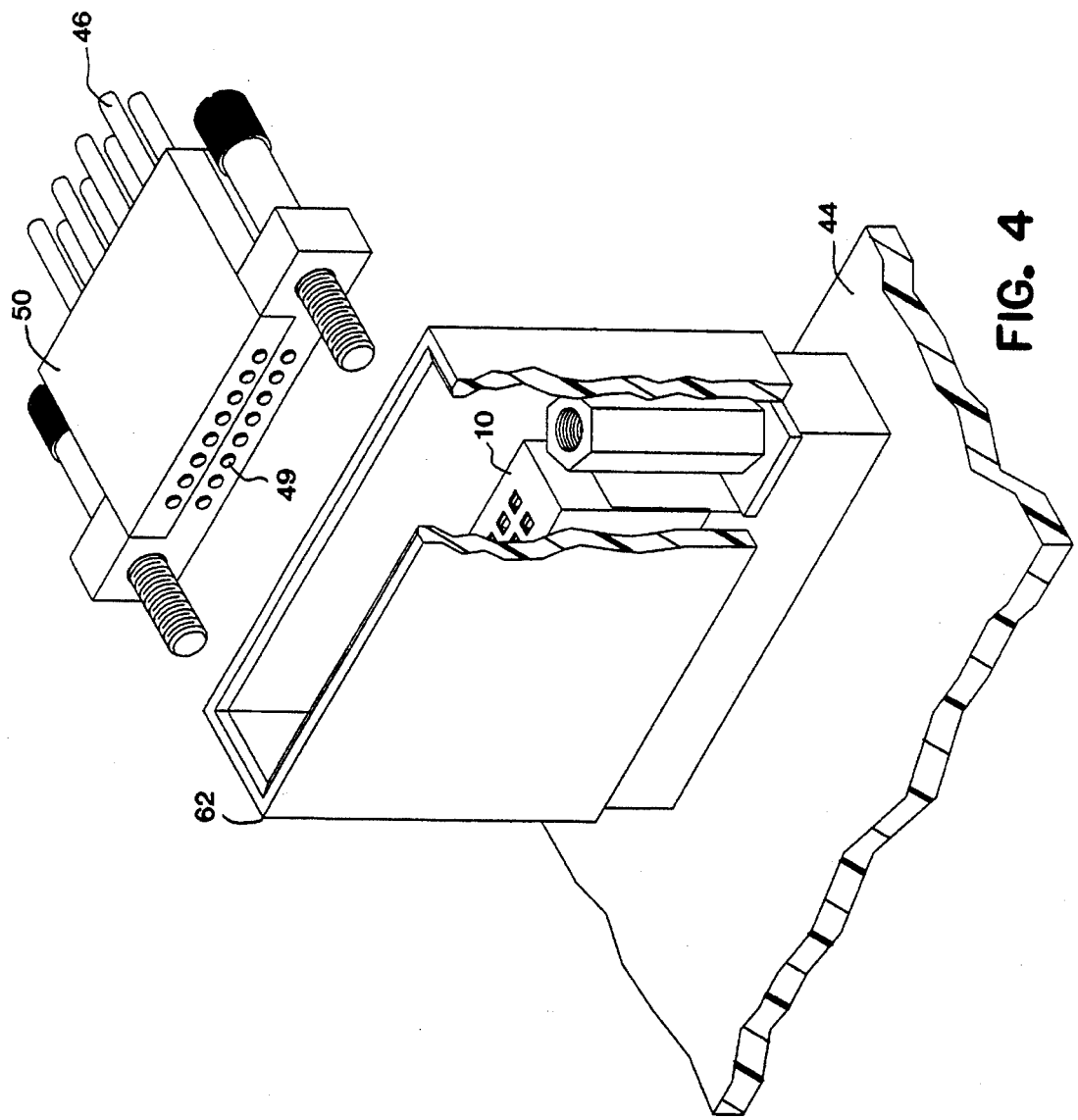
FIG. 4 is an environmental view of an alternate embodiment of the surface mating electrical connector of the present invention.

FIG. 4 illustrates an electrical connection which is comprised of an active electrical connector 10, a passive electrical connector 50, and an electrical shield housing 62. The shield housing 62 may be comprised of either a conductive or insulative structural material. When a conductive material, such as a metal is utilized, both structural protection and electrical shielding can be achieved. When an insulative material is employed, such as an insulative material of the type for housing 12, structural protection is afforded along with protection against unwanted electrical connections during handling of respective components.

The active electrical connector 10 illustrated in FIG. 5 is prepared for through hole mounting to a printed circuit board. This preparation primarily consists of positioning the termination ends 32 of the buckling beam elements 14 substantially parallel to the buckling beam elements with suitable adjustment to the spacing so that they will align and protrude through an array of apertures in the printed circuit board to which the connector will be mounted. These apertures are often plated through holes suitable for connection to the termination ends 32 by soldering.

The active electrical connector 10 illustrated in FIG. 6 is prepared for vertical surface mounting to a printed circuit board. This preparation primarily consists of positioning the termination ends 32 of the buckling beams 14 at outward pointing right angles to the buckling beam elements.

Figure 8:
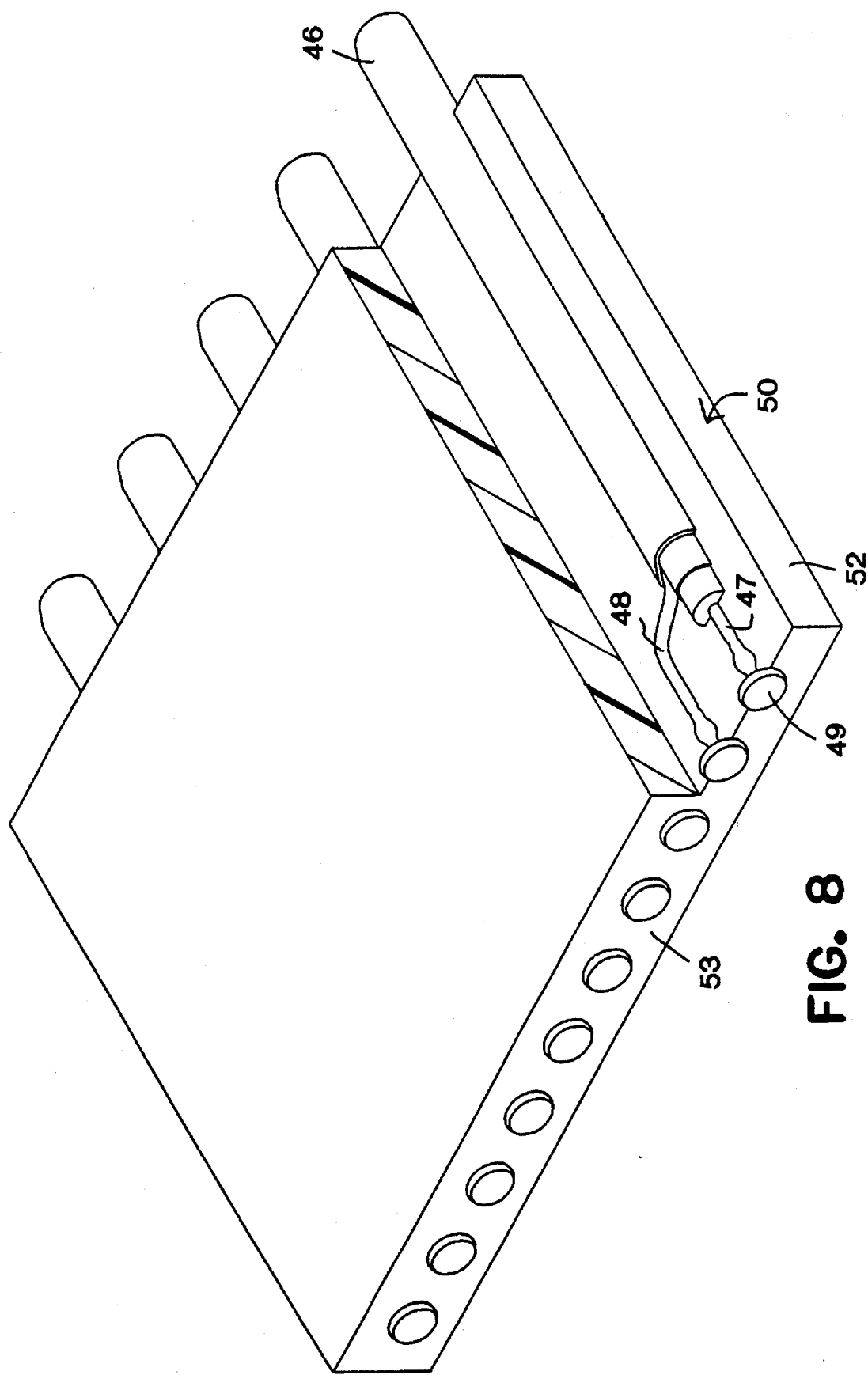
FIG. 8 is a perspective view of a mating passive electrical connector of the present invention.

FIG. 8 is a perspective view of an embodiment of a passive electrical connector 50 of the present invention as applied to coaxial cables. In this embodiment, each coaxial cable signal wire 47 is formed to provide a flat, circular conductive contact element 49. These conductive contact elements are accurately positioned within a housing assembly 52 to form a predetermined array on a face 53. The housing assembly 52 is formed of a structural insulating material, such as the type of materials described for the housing 12, for example.

Figure 9:
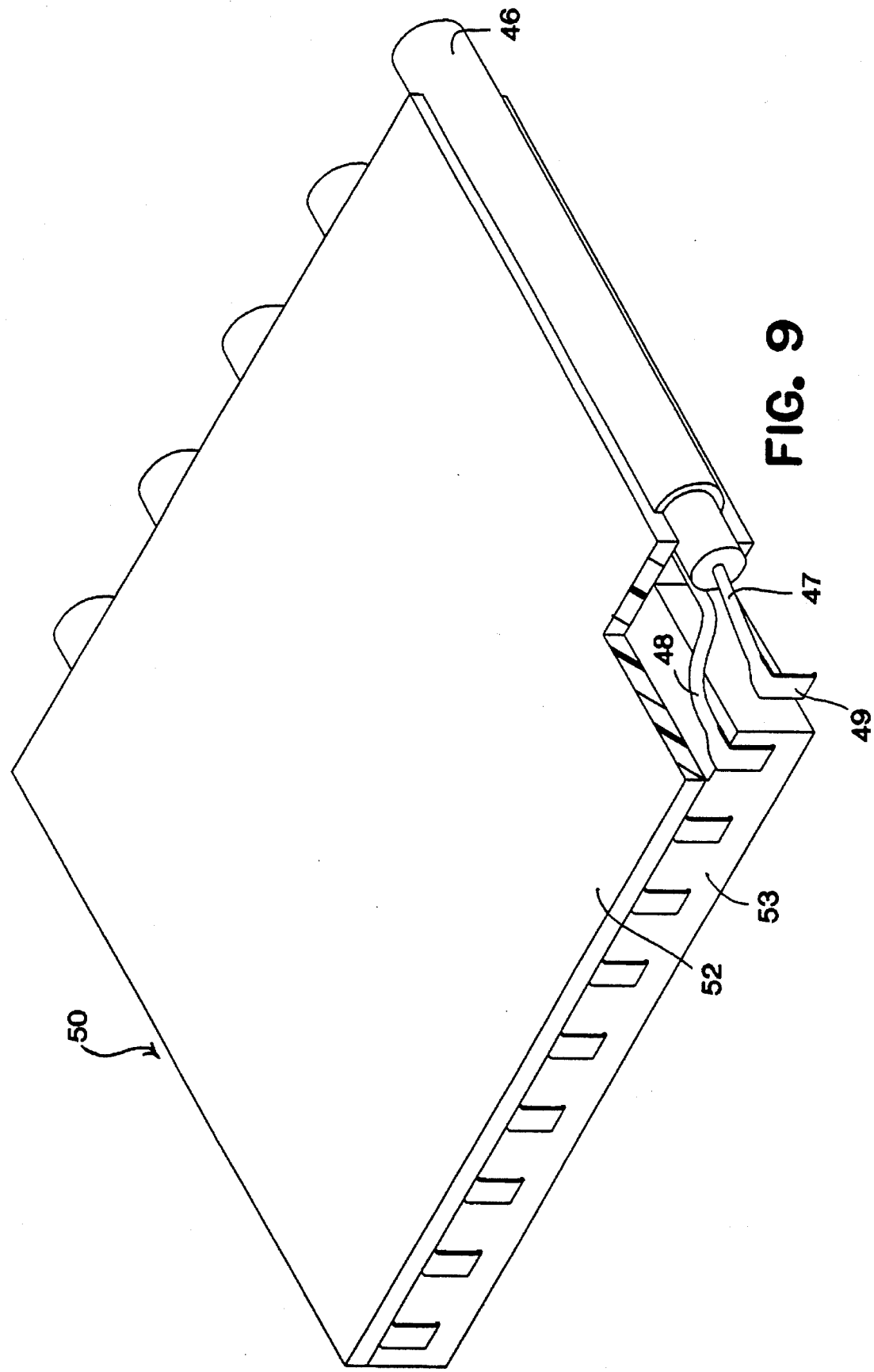
FIG. 9 is a perspective view of an alternate embodiment of the mating passive electrical connector of FIG. 8.

FIG. 9 is a perspective view of an alternate embodiment of the passive electrical connector 50 of FIG. 8. In this embodiment, the wires are formed into flat, square contacts.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. An electrical connector comprising:

at least one electrically insulating first housing portion;

at least one elongated flexible metal buckling beam element having a predetermined length and width dimension, wherein the length dimension is greater than the width dimension, the at least one buckling beam element being positioned in a predetermined location on the first housing portion, each at least one buckling beam element having a contact end and an opposed termination end, wherein the termination end of the at least one buckling beam element is fixedly positioned on the first housing portion;

preloading means for ensuring that the at least one buckling beam element bends predictably in a predetermined direction; and an electrically insulating second housing portion which at least partially encloses the at least one buckling beam element, the second housing portion having a facing surface portion having formed therethrough at least one aperture for permitting extension of the at least one buckling beam element therethrough, the second housing portion being moveable, back and forth, in a direction substantially parallel to the at least one buckling beam, from a first position wherein the second housing portion protectably encloses the contact end of the at least one buckling beam element, to a second position wherein the contact end of the at least one buckling beam element extends through the aperture.

2. The electrical connector of claim 1, wherein the preloading means is a protuberance formed integrally with the at least one first housing portion.

3. The electrical connector of claim 1, further comprising a biasing means for biasing the second housing portion in the first position.

4. The electrical connector of claim 3, wherein the biasing means exerts a predetermined biasing force to the facing surface portion of the second housing portion in a direction substantially parallel to the at least one buckling beam element.

5. The electrical connector of claim 4 wherein the biasing means comprises at least one buckling beam element.

6. The electrical connector of claim 1 further comprising:

means for limiting the range of back and forth travel of the second housing portion.

7. An electrical connector comprising:

an electrically insulating housing having a facing surface portion having formed therethrough at least one aperture;

at least one elongated flexible metal buckling beam element having a predetermined length and width dimension, wherein the length dimension is greater than the width dimension, the at least one buckling beam element being positioned in a predetermined location on the housing portion, each at least one buckling beam element having a contact end and an opposed termination end, wherein the termination end of the at least one buckling beam element is fixedly positioned on the housing; and means for selectably retracting the at least one buckling beam element within the electrically insulating housing, the selectable retracting means being moveable, back and forth, from a first position wherein the at least one buckling beam element is disposed within the housing thereby protecting the contact end of the at least one buckling beam element, to a second position wherein the contact end of the at least one buckling beam element extends through the aperture of the housing.

8. The electrical connector of claims 1 or 7 further comprising a passive electrical connector.

9. The electrical connector of claim 8, wherein the passive electrical connector comprises:

a structure for receiving the electrical connector in electrical connecting relation with the electrical conductor; and mounting means for fixedly mounting the electrical connector to the structure.

10. The electrical connector of claim 9, wherein the passive electrical connector further comprises at least one electrical conductor.

11. The electrical connector of claim 8, further comprising a plurality of buckling beam elements arranged in a predetermined linear pattern.

12. The electrical connector of claim 11, wherein the facing surface has formed therethrough a plurality of apertures arranged in a predetermined linear pattern which mirrors the predetermined linear pattern of the plurality of buckling beam elements, such that an individual buckling beam element extends through an individual aperture.

13. The electrical connector of claim 8, wherein the termination end of the at least one buckling beam element is electrically connected to an insulated wire.

14. The electrical connector of claim 11 further comprising a means for retaining the plurality of buckling beam elements in a predetermined aligned position.

15. The electrical connector of claim 8, wherein the termination end of the at least one buckling beam element is electrically connected to a printed circuit board.

16. The electrical connector of claim 8, wherein the termination ends of the plurality of buckling beam elements are connected to a plurality of conductors in a multiconductor cable.

17. The electrical connector of claim 8, wherein the termination end of one buckling beam element is electrically connected to a signal wire of a coaxial cable, and the termination end of a second buckling beam element is electrically connected to a ground wire of a coaxial cable.

18. The electrical connector of claim 8, wherein the termination end of the at least one buckling beam element is electrically connected to a multichip module.

19. The electrical connector of claim 8 wherein the termination end of the at least one buckling beam element is electrically connected to an integrated circuit.

20. An electrical connector comprising:

an active electrical connector member including, a) at least one electrically insulating first housing portion;

b) at least one elongated flexible metal buckling beam element having a predetermined length and width dimension, wherein the length dimension is greater than the width dimension, the at least one buckling beam element being positioned in a predetermined location on the first housing portion, each at least one buckling beam element having a contact end and an opposed termination end, wherein the termination end of the at least one buckling beam element is fixedly positioned on the first housing portion;

c) preloading means for ensuring that the at least one buckling beam element bends predictably in a predetermined direction;

d) an electrically insulating second housing portion which at least partially encloses the at least one buckling beam element, the second housing portion having a facing surface portion having formed therethrough at least one aperture for permitting extension of the at least one buckling beam element therethrough, the second housing portion being moveable, back and forth, in a direction substantially parallel to the at least one buckling beam, from a first position wherein the second housing portion protectably encloses the contact ends of the at least one buckling beam element, to a second position wherein the contact end of the at least one buckling beam element extends through the aperture; and a mating passive electrical connector member having at least one mating electrical conductor with a surface perpendicular to and aligned with the contact end of the at least one buckling beam, the contact end of the at least one buckling beam electrically communicating with the at least one mating electrical conductor when the second housing portion of the active electrical connector member is disposed in the second position.

21. An electrical connector comprising:

an electrically insulating active housing portion having a facing surface portion having formed therethrough at least one aperture and including;

a) at least one elongated flexible metal buckling beam element having a predetermined length and width dimension, wherein the length dimension is greater than the width dimension, the at least one buckling beam element being positioned in a predetermined location on the housing portion, each at least one buckling beam element having a contact end and an opposed termination end; and b) means for selectably retracting the at least one buckling beam element within the electrically insulating housing, the selectable retracting means being moveable, back and forth, from a first position wherein the at least one buckling beam element is disposed within the housing thereby protecting the contact end of the at least one buckling beam element, to a second position wherein the contact end of the at least one buckling beam element extends through the aperture of the housing; and an electrically insulating mating passive housing portion having at least one mating electrical conductor with a surface perpendicular to and aligned with the contact end of the at least one buckling beam, the contact end of the at least one buckling beam electrically communicating with the at least one mating electrical conductor when the selectable retracting means is disposed in the second position.

22. The electrical connector of claims 20 or 21, further comprising a means for selectably coupling the active and passive electrical connector members.

23. The electrical connector of claims 20 or 21, further comprising an electrical shield housing.

24. The electrical connector of claim 22, wherein the means for selectably coupling the active and passive electrical connector members is at least one threaded fastener.

* * * * *